United States Patent
Ionita et al.

(10) Patent No.: US 10,469,099 B2
(45) Date of Patent: Nov. 5, 2019

(54) APPARATUS AND METHOD FOR MULTILEVEL CODING (MLC) WITH BINARY ALPHABET POLAR CODES

(71) Applicant: TEXAS INSTRUMENTS INCORPORATED, Dallas, TX (US)

(72) Inventors: Corina Ioana Ionita, Houston, TX (US); June Chul Roh, Allen, TX (US); Mohamed F. Mansour, Cupertino, CA (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/152,754

(22) Filed: Oct. 5, 2018

(65) Prior Publication Data

US 2019/0044530 A1 Feb. 7, 2019

Related U.S. Application Data

(62) Division of application No. 14/503,547, filed on Oct. 1, 2014, now Pat. No. 10,135,460.

(Continued)

(51) Int. Cl.
*H03M 7/00* (2006.01)
*H03M 5/18* (2006.01)
(Continued)

(52) U.S. Cl.
CPC ............ *H03M 5/18* (2013.01); *H03M 13/251* (2013.01); *H04L 1/0041* (2013.01);
(Continued)

(58) Field of Classification Search
CPC .. H03M 13/255; H03M 13/45; H03M 13/112; H03M 13/256; H03M 13/1111;
(Continued)

(56) References Cited

U.S. PATENT DOCUMENTS 5,150,381 A 9/1992 Forney, Jr.
5,195,107 A 3/1993 Wei
(Continued)

OTHER PUBLICATIONS

Mansour, et al.; U.S. Appl. No. 14/502,011; "Apparatus and Method for Multilevel Coding in Communication Systems"; filed Sep. 30, 2014; 43 pages.
(Continued)

*Primary Examiner* — Linh V Nguyen
(74) *Attorney, Agent, or Firm* — Michelle F. Murray; Charles A. Brill; Frank D. Cimino

(57) ABSTRACT

A method includes receiving multiple bits to be transmitted. The method also includes applying a first binary alphabet polar code to a first subset of the multiple bits to generate first encoded bits. The first encoded bits are associated with a first bit level of a multilevel coding scheme. The method further includes generating one or more symbols using the first encoded bits and bits associated with a second bit level of the multilevel coding scheme. The first binary alphabet polar code is associated with a first coding rate. In addition, the method could include applying a second binary alphabet polar code to a second subset of the multiple bits to generate second encoded bits. The second encoded bits are associated with the second bit level. The second binary alphabet polar code is associated with a second coding rate such that the bit levels have substantially equal error rates.

20 Claims, 8 Drawing Sheets

Related U.S. Application Data

(60) Provisional application No. 61/885,351, filed on Oct. 1, 2013.

(51) Int. Cl.

| | | |
|---|---|---|
| *H03M 13/25* | (2006.01) | |
| *H04L 25/49* | (2006.01) | |
| *H04L 27/36* | (2006.01) | |
| *H04L 1/00* | (2006.01) | |
| *H03M 13/13* | (2006.01) | |
| *H03M 13/15* | (2006.01) | |

(52) U.S. Cl.
CPC ........ *H04L 1/0058* (2013.01); *H04L 25/4917* (2013.01); *H04L 27/364* (2013.01); *H03M 13/13* (2013.01); *H03M 13/152* (2013.01); *H03M 13/255* (2013.01); *H04L 27/36* (2013.01)

(58) Field of Classification Search
CPC ............. H03M 13/1515; H03M 13/25; H03M 13/2957; H03M 13/09; H03M 13/1102; H03M 13/27; H03M 13/6325; H03M 13/114; H03M 13/1191; H03M 13/2792; H03M 13/2906; H03M 13/3707; H04L 1/0003; H04L 1/0009; H04L 27/3405; H04L 27/3483; H04L 1/0058; H04L 25/4917; H04L 27/364; H04L 1/0071; H04L 1/0054; H04L 1/007; H04L 1/02
USPC ........................ 341/156, 157, 74, 75, 76, 94
See application file for complete search history.

(56) References Cited

U.S. PATENT DOCUMENTS

| | | | | |
|---|---|---|---|---|
| 5,214,672 | A | 5/1993 | Eyuboglu | |
| 5,233,630 | A * | 8/1993 | Wolf | H03M 13/25 375/262 |
| 5,844,922 | A * | 12/1998 | Wolf | H03M 13/256 714/786 |
| 5,848,102 | A * | 12/1998 | Zehavi | H03M 13/25 375/261 |
| 6,118,826 | A * | 9/2000 | Zehavi | H03M 13/256 375/261 |
| 6,216,654 | B1 * | 4/2001 | Regueiro | F01L 1/34 123/90.15 |
| 6,456,666 | B1 | 9/2002 | Gabara | |
| 6,707,857 | B1 | 3/2004 | Cairns | |
| 7,073,116 | B1 * | 7/2006 | Settle | H03M 13/25 714/786 |
| 7,180,955 | B2 * | 2/2007 | Onggosanusi | H03M 13/258 375/265 |
| 7,458,009 | B2 * | 11/2008 | Yu | H03M 13/1114 714/800 |
| 8,347,186 | B1 | 1/2013 | Arikan | |
| 8,787,477 | B2 | 7/2014 | Mansour | |
| 8,952,834 | B1 | 2/2015 | Cronie | |
| 2002/0106004 | A1 | 8/2002 | Tan | |
| 2006/0140302 | A1 | 6/2006 | Jahan | |
| 2008/0320362 | A1 * | 12/2008 | Taubin | H03M 13/11 714/755 |
| 2009/0135946 | A1 | 5/2009 | Dowling | |
| 2013/0117344 | A1 | 5/2013 | Gross | |
| 2014/0040214 | A1 | 2/2014 | Ma | |
| 2014/0129896 | A1 | 5/2014 | Parthasarathy | |
| 2014/0153625 | A1 * | 6/2014 | Vojcic | H04L 1/005 375/224 |
| 2014/0169492 | A1 | 6/2014 | Mandavifar | |
| 2014/0177740 | A1 | 6/2014 | Mansour | |
| 2014/0208183 | A1 | 7/2014 | Mandavifar | |
| 2014/0331083 | A1 | 11/2014 | Aliev | |
| 2015/0077277 | A1 | 3/2015 | Alhussien | |
| 2015/0078486 | A1 | 3/2015 | Wang | |
| 2015/0103947 | A1 | 4/2015 | Shen | |
| 2015/0222295 | A1 | 8/2015 | Li | |

OTHER PUBLICATIONS

Ionita, et al.; U.S. Appl. No. 14/503,513; "Apparatus and Method for Supporting Polar Code DEsigns"; filed Oct. 1, 2014; 36 pages.
Miller, et al.; "End-to-End Communication Test on Variable Length Packet Structures Utilizing AOS Testbed"; Third International Symposium on Space Mission Operations and Ground Data Systems; Nov. 1994; 9 pages.
Prodan, et al.; "Forward Error Correction Proposal for EPOC Phy Layer"; printed from http://www.ieee802.org131bnlpubliclsept121prodan_01 b_0912.pdf; Broad com; IEEE 802.3bn EPoC; Sep. 2012; 13 pages.
Arikan, E.; "Channel Polarization: A Method for Constructing Capacity—Achieving Codes for Symmetric Binary-Input Memoryless Channels"; IEEE Transactions on Information Theory; vol. 55; Jul. 2009; 23 pages.
Arikan, et al.; "On the Rate of Channel Polarization"; IEEE International Symposium on Information Theory; No. 2; Jun. 2009; 5 pages.
Hassani, et al.; "Rate-Dependent Analysis of the Asymptotic Behavior of Channel Polarization"; IEEE Transactions on Information Theory; vol. 59; Apr. 2013; 10 pages.
Sasoglu, et al.; "Polarization for Arbitrary Discrete Memoryless Channels"; IEEE Information Theory Workshop; vol. 2; 2009; 5 pages.
Leroux, et al.; "A Semi-Parallel Successive-Cancellation Decoder for Polar Codes"; IEEE Transactions on Signal Processing; vol. 61; Jan. 2013; 11 pages.
Wachsmann, et al.; "Multilevel Codes: Theoretical Concepts and Practical Design Rules"; IEEE Transactions on Information Theory; vol. 45; Jul. 1999; 31 pages.
Shin, et al.; "Mapping Selection and Code Construction for 2m-ary Polar-Coded Modulation"; IEEE Communications Letters; vol. 16; Jun. 2012; 4 pages.
Seidl, et al.; "Polar-Coded Modulation"; printed from http://arxiv.org/abs/ 1302.2855v1; Feb. 2013; 11 pages.
Mori, et al.; "Performance of Polar Codes with the Construction Using Density Evolution"; IEEE Communications Letters; vol. 13; Jul. 2009; 3 pages.
Korada, et al.; "Polar Codes: Characterization of Exponent, Bounds, and Constructions"; IEEE Transactions on Information Theory; vol. 56; Dec. 2010; 12 pages.
Tal, et al.; "How to Construct Polar Codes"; printed from http://arxiv.org/abs/ 1105.6164; May 2011; 21 pages.
Mori, et al.; "Performance and Construction of Polar Codes on Symmetric Binary-Input Memoryless Channels"; IEEE International Symposium on Information Theory; IEEE; Jun. 2009; 5 pages.
Tal, et al.; "List Decoding of Polar Codes"; Information Theory Proceedings (ISIT); IEEE International Sumposium; 2011; 11 pages.
Kumar, et al. "A GPU Implementation of Belief Propagation Decoder for Polar Codes"; Signals, Systems and Computers (ASILOMAR); Conference Record of the Forty Sixth Asilomar Conference; 2012; 5 pages.
Goldsmith, et al. "Adaptive Coded Modulation for Fading Channels"; IEEE Transactions on Communications; vol. 46; May 1998; 8 pages.
"3rd Generation Partnership Project; Technical Specification Group Radio Access Network; Evolved Universal Terrestrial Radio Access (E-UTRA); Multiplexing and Channel Coding"; 3GPP TS 36.212; Release 9.2.0; Jun. 2010; 61 pages.
Sasoglu, E; "An Entropy Inequality for q-ary Random Variables and its Application to Channel Polarization"; IEEE Initernational Symposium on Information Theory; IEEE; Jun. 2010; 4 pages.
Sasoglu, E.; "Polar Codes for Discrete Alphabets"; IEEE Iinternational Symposium on Information Theory Proceedings; vol. 1; Jul. 2012; 5 pages.

* cited by examiner

APPARATUS AND METHOD FOR MULTILEVEL CODING (MLC) WITH BINARY ALPHABET POLAR CODES

CROSS-REFERENCE TO RELATED APPLICATION AND PRIORITY CLAIM

This application is a divisional of prior application Ser. No. 14/503,547, filed Oct. 1, 2014, and claims priority under 35 U.S.C. § 119(e) to U.S. Provisional Patent Application No. 61/885,351 filed on Oct. 1, 2013. This provisional patent application is hereby incorporated by reference in its entirety.

TECHNICAL FIELD

This disclosure is generally directed to communication systems. More specifically, this disclosure is directed to an apparatus and method for multilevel coding (MLC) with binary alphabet polar codes.

BACKGROUND

Many modern wireless and other communication systems encode digital data for transmission over communication paths. One type of coding mechanism involves the use of polar codes, which are used to encode data bits into encoded data bits that are then mapped into symbols for transmission. Polar codes can be used to achieve capacity of binary-input memoryless symmetric channels, meaning the polar codes allow the full capacity of a channel to be utilized. Polar codes allow this to be achieved using low-complexity encoding and decoding algorithms.

Recently, various attempts have been made to use communication channels more efficiently based on higher-order modulation techniques, such as M-ary quadrature amplitude modulation (M-QAM). The phrase "M-ary" modulation generally refers to modulation where there are M constellation points so that one symbol carries $\log_2(M)$ bits.

Extending the use of polar codes to systems that use higher-order modulation techniques is not a simple task. For example, output bits from a binary polar code often experience different effective channels because of their mapping to higher-order symbols. As a result, standard techniques for polar code design are not generally applicable to systems using higher-order modulation techniques.

SUMMARY

This disclosure provides an apparatus and method for multilevel coding (MLC) with binary alphabet polar codes.

In a first embodiment, a method includes receiving multiple bits to be transmitted. The method also includes applying a first binary alphabet polar code to a first subset of the multiple bits to generate first encoded bits. The first encoded bits are associated with a first bit level of a multilevel coding scheme. The method further includes generating one or more symbols using the first encoded bits and bits associated with a second bit level of the multilevel coding scheme. The first binary alphabet polar code is associated with a first coding rate.

In a second embodiment, a first encoder is configured to (i) receive multiple bits to be transmitted and (ii) apply a first binary alphabet polar code to a first subset of the multiple bits to generate first encoded bits. The first encoded bits are associated with a first bit level of a multilevel coding scheme. The apparatus also includes a symbol generator configured to map the first encoded bits and bits associated with a second bit level of the multilevel coding scheme to one or more symbols for transmission. The first binary alphabet polar code is associated with a first coding rate.

In a third embodiment, a method includes applying a first binary alphabet polar code to first decoding information associated with one or more symbols to generate first decoded bits. The first decoding information is associated with a first bit level of a multilevel coding scheme. The method also includes outputting the first decoded bits and bits associated with a second bit level of the multilevel coding scheme. The first binary alphabet polar code is associated with a first coding rate.

In a fourth embodiment, an apparatus includes a first decoder configured to apply a first binary alphabet polar code to first decoding information associated with one or more symbols to generate first decoded bits. The first decoding information is associated with a first bit level of a multilevel coding scheme, and the multilevel coding scheme has a second bit level. The first binary alphabet polar code is associated with a first coding rate.

In a fifth embodiment, a method includes identifying a target error rate associated with a multilevel coding scheme, where the multilevel coding scheme has multiple bit levels. The method also includes identifying an effective signal-to-noise ratio (SNR) at each of the bit levels, where the effective SNR is based on a symbol mapping rule used to map bits into symbols. The method further includes identifying a code rate at each bit level using the target error rate and the SNR at that bit level. In addition, the method includes selecting, at one or more of the bit levels, at least one polar code having at least one of the identified code rates so that an overall error rate of each bit level is substantially equal.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1A through 10, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1A:
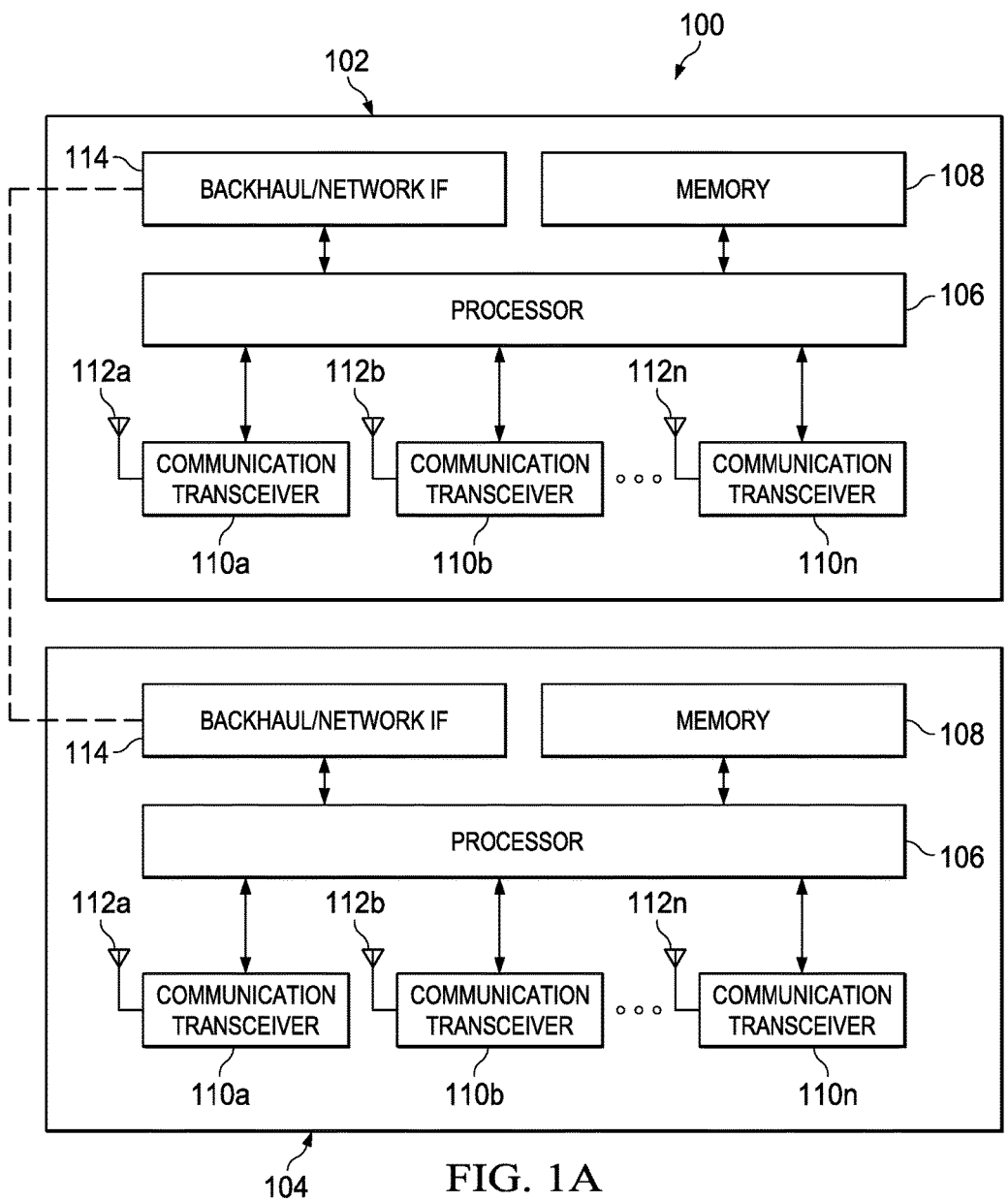
FIGS. 1A and 1B illustrate example systems that use multilevel coding (MLC) with binary alphabet polar codes in accordance with this disclosure.
Figure 1B:
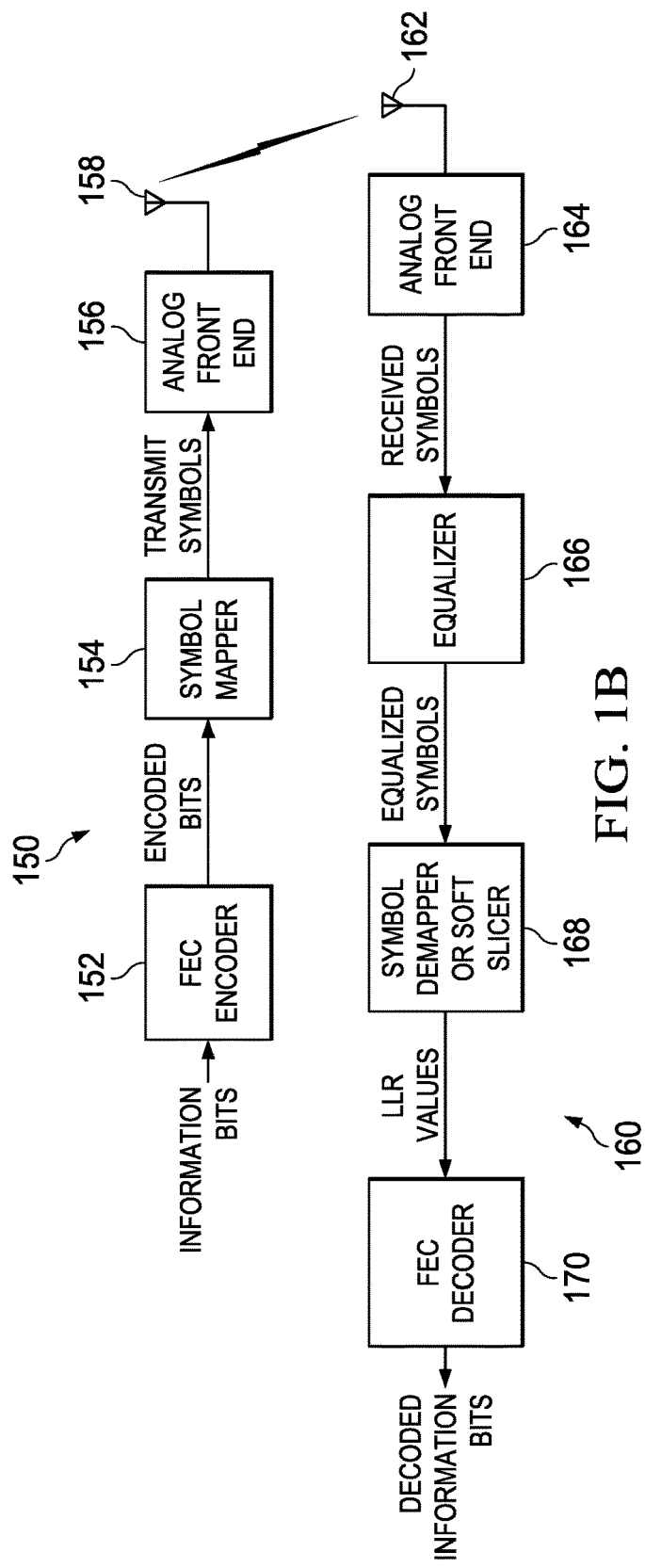

FIGS. 1A and 1B illustrate example systems that use multilevel coding (MLC) with binary alphabet polar codes in accordance with this disclosure. The systems shown in FIGS. 1A and 1B are for illustration only. The techniques described in this patent document could be used to support wireless or other communications that use MLC with higher-order modulation (such as M-ary quadrature amplitude modulation) and binary alphabet polar codes between or with any suitable devices or systems.

As shown in FIG. 1A, a system 100 includes base stations 102-104. Each base station 102-104 shown in FIG. 1A generally denotes an infrastructure component that provides wireless service to one or more wireless devices. Other types of infrastructure components that are encompassed by the phrase "base station" include enhanced Node Bs (eNBs) and access points. Similarly, a base station can communicate with any number of wireless devices, each of which generally denotes a device that receives wireless service from at least one infrastructure component. Other types of devices that are encompassed by the phrase "wireless device" include mobile stations, user equipment, wireless terminals, or other fixed or mobile devices. The base stations 102-104 could communicate using any suitable protocol(s) supporting the use of polar codes.

As shown in FIG. 1A, each base station 102-104 includes at least one processing device 106 and at least one memory 108. The at least one processing device 106 executes logic in order to control the overall operation of the base station 102-104 and to support communications with wireless devices. The exact operations of the processing device(s) 106 can vary depending on, for example, the protocol(s) supported by the base stations 102-104. Each processing device 106 includes any suitable processing or control device, such as a microprocessor, microcontroller, digital signal processor (DSP), field programmable gate array (FPGA), application specific integrated circuit (ASIC), or discrete logic devices. The at least one memory 108 stores instructions and data used, generated, or collected by the base station 102-104. Each memory 108 includes any suitable volatile or non-volatile storage and retrieval device, such as a random access memory (RAM) or a Flash or other read-only memory (ROM).

Each base station 102-104 also includes multiple communication transceivers 110a-110n, each of which (if implemented to support wireless communications) may be coupled to at least one of multiple antennas 112a-112n. Each communication transceiver 110a-110n supports communications with other devices, such as portable or other wireless devices. Each communication transceiver 110a-110n includes any suitable structure supporting communications over one or more wired or wireless communication channels. For example, each communication transceiver 110a-110n can include transmit circuitry that facilitates the transmission of signals from the communication transceiver and receive circuitry that facilitates the processing of signals received by the communication transceiver. Each antenna 112a-112n represents any suitable structure for transmitting and receiving communication signals, such as a radio frequency (RF) antenna. Note that while each communication transceiver 110a-110n is shown here as having its own antenna 112a-112n, multiple communication transceivers could share one or more common antennas, or each communication transceiver could have multiple antennas.

A backhaul interface 114 supports communications between the base stations 102-104 themselves or between a base station 102-104 and other component(s) via a backhaul network. For example, the backhaul interface 114 could allow the base stations 102-104 to communicate with one another. The backhaul interface 114 includes any suitable structure for facilitating communications over a backhaul network, such as a microwave communications unit or an optical fiber interface.

FIG. 1B illustrates an example system having a point-to-point transmitter 150 and receiver 160. The transmitter 150 and the receiver 160 could be used in the base stations 102-104 of FIG. 1A (such as in or with the processors 106, communication transceivers 110a-110n, or backhaul interfaces 114) or in any other suitable devices. As shown in FIG. 1B, the transmitter 150 includes a forward error correction (FEC) encoder 152, a symbol mapper 154, an analog front end 156, and at least one antenna 158. The FEC encoder 152 receives information bits and generates encoded bits, such as by using MLC with binary alphabet polar codes as described below. The symbol mapper 154 maps the encoded bits into transmit symbols, which the analog front end 156 transmits wirelessly via the antenna(s) 158.

The receiver 160 includes at least one antenna 162, an analog front end 164, an equalizer 166, a symbol demapper or soft slicer 168, and an FEC decoder 170. The analog front end 164 receives symbols transmitted from the transmitter 150 via the antenna(s) 162 and provides the received symbols to the equalizer 166. The equalizer 166 pre-processes the received symbols, and the equalized symbols are used to generate log-likelihood ratio (LLR) values by the symbol demapper or soft slicer 168. The LLR values are used by the FEC decoder 170 to generate decoded information bits. Ideally, the decoded information bits from the FEC decoder 170 match the information bits provided to the FEC encoder 152.

Communications from a transmitter to a receiver can occur using various modulation techniques, such as binary modulation or M-QAM. Higher-order modulation techniques are often desirable because they allow systems to achieve very high levels of spectral efficiency. However, as noted above, standard techniques for polar code design are not generally applicable to systems using higher-order modulation techniques.

This disclosure describes techniques that support the use of MLC with binary alphabet polar codes, including for use in systems that use higher-order modulation techniques such as M-ary QAM. The design of a specific polar code is equivalent to determining a set of "frozen bits" in an input vector. A "frozen bit" denotes a bit whose value is fixed in both the input vector to a polar encoder and in an output vector from a polar decoder. The remaining bits in the input and output vectors are called "information bits" and can be used to transport data over a wireless or other channel.

Some conventional approaches use a set of information bits and frozen bits obtained from Monte Carlo simulations that are run for binary input polar codes or that are optimized for cases when a binary erasure channel (BEC) is used. Early work in polar code design focused on binary channels where the outputs of an encoder are subject to the same binary input channel, meaning bits at the output of the encoder experience the same channel before a decoder. Extending polar codes to higher-order constellations may be necessary for deployment in practical communication systems, which usually use higher-order modulation for better spectral efficiency. Further, binary codes are usually used in practice, and the mapping to higher-order constellations is typically done after the encoder (rather than using non-binary codes). Although the capacity-achieving property of polar codes has been extended to M-ary input alphabets, the combination of (i) binary polar codes and higher-order modulations and (ii) specific designs for QAM modulations in the presence of additive white Gaussian noise (AWGN) has not been fully investigated. The main difficulty in this case is that the output bits from a binary polar encoder experience different effective channels because of their mapping to higher-order symbols. Therefore, standard techniques for polar code design in general are not applicable.

As described in more detail below, this patent document enables the use of binary polar codes with higher-order modulations. A multilevel coding approach uses one or more binary alphabet polar codes (each possibly with a different code parameter or configuration such as code rate or frozen bit locations) with one or more wireless or other communication channels, such as one or more AWGN channels. For example, with a special symbol mapping rule (such as those shown in FIGS. 2, 4, and 6 described below), one or more channels can be partitioned into m bit levels (also called "bit channels"), which are typically identified based on the bit position of the symbol word (symbol mapper input). Different bit levels have different signal-to-noise ratio (SNR) properties. The bits in each bit level experience the same communication channel with the same effective SNR, so the code design problem is reduced to the design of one or more binary codes with suitable code rate(s). The rate of a polar code for a particular bit channel can be selected using knowledge of the Euclidian distance for a bit level in a corresponding multilevel pulse amplitude modulation (M-PAM) scheme, assuming bits in lower bit levels are decoded correctly and known. Thus, the overall error rate (such as the bit error rate or "BER") for a polar code is substantially characterized or determined by the required rate of the code at a given channel SNR.

Moreover, polarization parameters obtained for true equivalent bit channels can be used when selecting the rates for the polar codes. Many conventional approaches that use MLC with polar codes use polarization parameters optimized with a binary input alphabet for a simple channel (such as a binary erasure channel). In accordance with this disclosure, for higher-order modulation in an AWGN channel, different polarization parameters can be used for different channels that are "seen" by the different bit levels.

Once the rate of each polar code is identified, data is transmitted over at least one wireless or other channel as symbols created using the polar code(s). At a receiver, a decoder can be applied at each bit level, such as by using successive cancellation (SC) decoders starting with the least significant bit (LSB).

Various benefits can be obtained using this approach, although the specific benefits depend on the particular implementation. For example, binary alphabet polar codes can allow for the use of low-complexity encoding and decoding techniques, which can substantially reduce the complexity of the overall multilevel coding technique. Also, the use of polar codes can provide large performance improvements when used with multilevel coding techniques compared to approaches that use a single level of coding. When the code rates for all bit channels are optimized, MLC provides better performance than a single binary input alphabet mapped to a higher-order modulation. In addition, it has been shown that polar codes do not have an error floor, which means they can be used in various applications that require higher-order modulations and very low error performance. Note that these benefits are unique because they can be obtained using one or more AWGN channels, while many conventional approaches that use MLC with polar codes derive results for binary erasure channels only.

Figure 6:
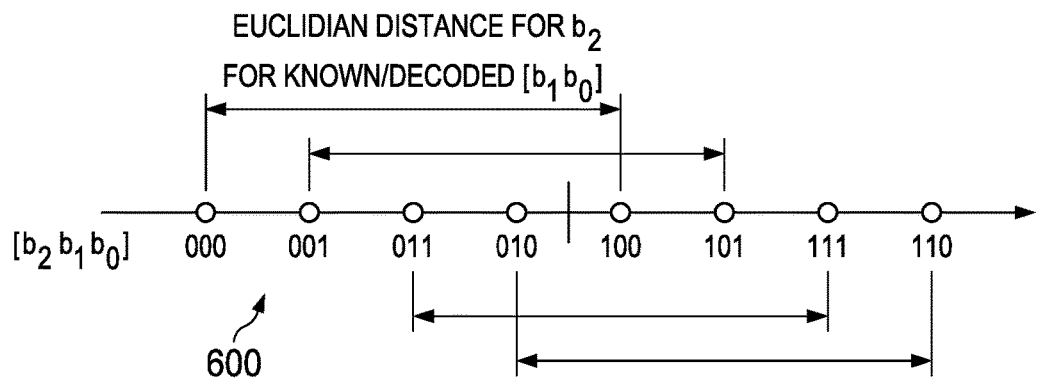
Figure 7:
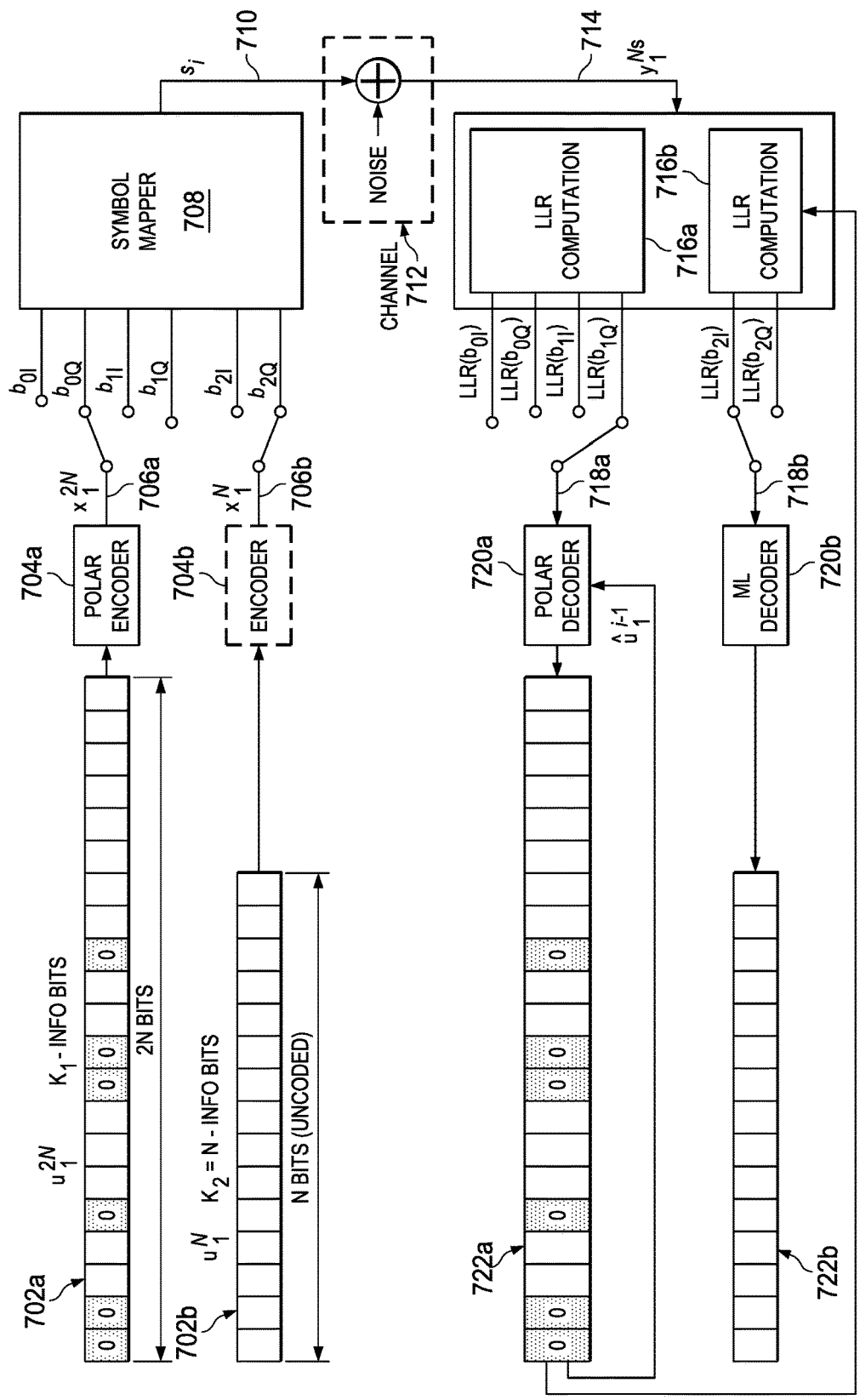

Additional details regarding the use of MLC with binary alphabet polar codes are provided below. In the discussion below, two general schemes are described as being used to support MLC with binary alphabet polar codes. In a first MLC scheme (such as is shown in FIGS. 2 through 5), each binary polar code corresponds to one bit in a bit-to-symbol mapping for each of the in-phase (I) and quadrature (Q) directions. In a second MLC scheme (such as is shown in FIGS. 6 and 7), a binary polar code corresponds to more than one bit in a bit-to-symbol mapping for each of the I and Q directions.

Although FIGS. 1A and 1B illustrate examples of systems that use MLC with binary alphabet polar codes, various changes may be made to FIGS. 1A and 1B. For example, MLC with binary alphabet polar codes could be used in any other suitable system. Moreover, infrastructure components, networks, transmitters, and receivers come in a wide variety of designs and configurations, and FIGS. 1A and 1B do not limit the scope of this disclosure to any particular infrastructure component, network, transmitter, or receiver.

FIGS. 2 through 7 illustrate example encoding and decoding schemes supporting MLC with binary alphabet polar codes in accordance with this disclosure. The encoding and decoding schemes could, for example, be used by the base stations 102-104 or by the transmitter 150 and receiver 160 to communicate over one or more wireless or other communication channels. However, the encoding and decoding schemes could be used with any other suitable devices and in any other suitable systems.

Figure 2:
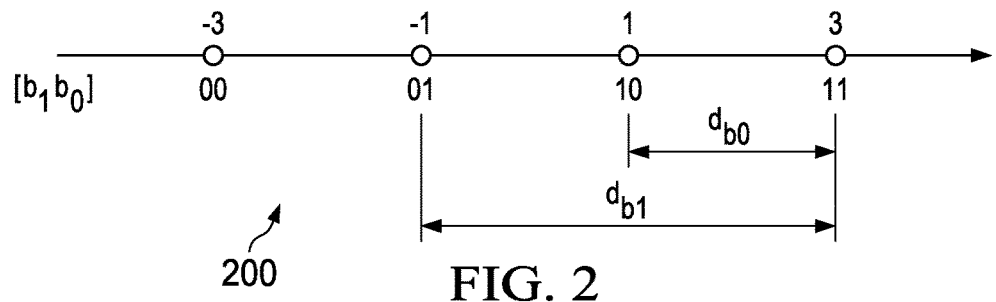
FIGS. 2 through 7 illustrate example encoding and decoding schemes supporting MLC with binary alphabet polar codes in accordance with this disclosure.
Figure 3:
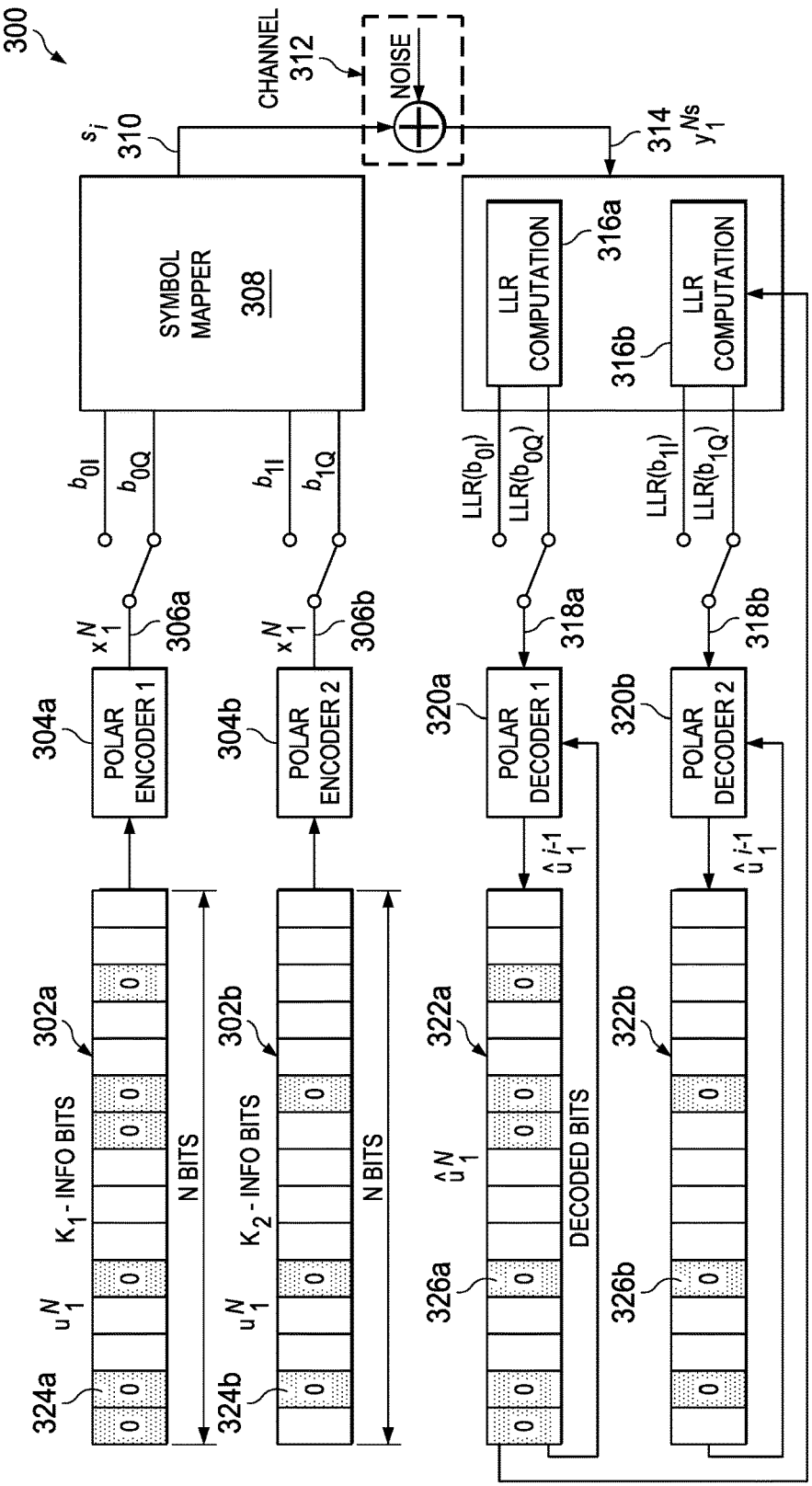

FIGS. 2 and 3 illustrate a first example implementation of a coding scheme in which each of multiple binary polar codes corresponds to one bit in each of the I and Q directions. FIG. 2 illustrates an example symbol mapping 200, which can be used with 16-QAM modulation. Each of the I and Q directions independently uses the same mapping as 4-PAM, where $(b_1\ b_0)$ denotes the bit mapping to a symbol, with $b_1$ and $b_0$ representing the most significant bit (MSB) and the least significant bit (LSB), respectively. In FIG. 2, $d_{b0}$ represents the minimum Euclidian distance for $b_0$, and $d_{b1}$ represents the minimum Euclidian distance for $b_1$ (assuming that the bit value for $b_0$ is correctly decoded and known at the receiver before making a decision for $b_1$). In other words, during decoding, the bit value for $b_0$ is determined, and the decoded bit value for $b_0$ is used to decode the bit value for $b_1$.

An encoding and decoding system 300 that supports this symbol mapping 200 is shown in FIG. 3. As shown in FIG. 3, input vectors $u_1^N$ 302a-302b (each containing N bits) are respectively provided to polar encoders 304a-304b. The polar encoders 304a-304b use the input vectors 302a-302b and different polar codes to generate codewords $x_1^N$ 306a-306b, respectively, which represent encoded vectors (each containing N bits). As described in more detail below, each polar code includes a set of frozen bits with the remaining bits being information bits. The code rate $R_1$ for the first polar code used by the polar encoder 304a is expressed as $K_1/N$, and code rate $R_2$ for the second polar code used by the polar encoder 304b is expressed as $K_2/N$ (where $K_1$ and $K_2$ denote the number of information bits for the polar codes). The overall code rate R can be calculated as $(K_1+K_2)/2N = (R_1+R_2)/2$. At a given channel condition (such as a given SNR), the $K_1$ or $K_2$ value cannot be increased, which acts as a limit to the code rate for the given channel condition. In the discussion below, $N_s$ denotes the number of QAM symbols that carry 2N encoded bits and can equal N/2. The codewords 306a-306b are provided to a symbol mapper 308, which generates a series of transmit symbols 310. Each polar encoder 304a-304b includes any suitable structure for generating codewords using a binary alphabet polar code. The symbol mapper 308 includes any suitable structure for mapping codewords to symbols.

The symbols 310 are transmitted over at least one communication channel 312, which suffers from noise. Each channel 312 could represent any suitable communication channel, such as a wireless or fiber optic channel. In some embodiments, each channel 312 could be estimated as an AWGN channel.

The symbols 310, as transported over the channel(s) 312 and affected by noise, are received as symbols $y_1^{Ns}$ 314. LLR calculators 316a-316b compute LLR values for different portions of the received symbols 314 to generate blocks 318a-318b of LLR values. Polar decoders 320a-320b decode the received symbols 314 using the LLR blocks 318a-318b and the polar codes to generate output vectors $\hat{u}_1^N$ 322a-322b. Ideally, the output vectors 322a-322b match the input vectors 302a-302b. The output vectors 322a-322b could be provided to any suitable destination(s), such as to a common destination or to multiple destinations via demultiplexing. Each of the polar decoders 320a-320b can support successive cancellation and use feedback in the form of at least some of the bits (such as the least significant bits) from one or more prior output vectors 322a-322b when decoding one or more current LLR blocks 318a-318b. Each LLR calculator 316a-316b includes any suitable structure for computing LLR values. Each polar decoder 320a-320b includes any suitable structure for generating decoded bits using LLR values and a polar code.

There are various "frozen" bits 324a-324b contained in the input vectors 302a-302b and corresponding "frozen" bits 326a-326b contained in the output vectors 322a-322b. As noted above, each frozen bit 324a-324b, 326a-326b denotes a bit whose value is fixed (either to a "1" or a "0") in both the input vector to a polar encoder and in the output vector from a polar decoder. The remaining bits in the input vectors 302a-302b and the output vectors 322a-322b represent information bits and are used to transport data.

To support multilevel coding, the LLR calculators 316a-316b operate sequentially on the received symbols 314, meaning the LLR calculator 316b (on a second bit level) generates LLR values using decoded outputs from the polar decoder 320a (on a first bit level). For example, in response to receiving a set of symbols 314, the LLR calculator 316a can output channel LLR blocks 318a (such as column vectors of length N) to the polar decoder 320a. The LLR calculator 316b uses a new output vector $\hat{u}_1^N$ 322a from the polar decoder 320a to generate LLR blocks 318b at a second bit level.

In the example shown in FIG. 3, the MLC scheme for 16-QAM employs two binary polar codes. The polar encoder 304a and the polar decoder 320a support a first polar code with a binary alphabet for the first bit level, with one bit ($b_{0I}$) in the I direction and one bit ($b_{0Q}$) in the Q direction. The polar encoder 304b and the polar decoder 320b support a second polar code with a binary alphabet for the second bit level, with one bit ($b_{1I}$) in the I direction and one bit ($b_{1Q}$) in the Q direction. Here, when decoding an $i^{th}$ information bit, any lower decoded bits are used, meaning the second information bit is decoded using the decoded value of the first information bit, the third information bit is decoded using the decoded values of the first and second information bits, and this process can be repeated until all bits are decoded. Note, however, that other forms of decoding could be used, such as list decoding or belief-propagation decoding. Moreover, note that this approach can be easily extended to support higher-order modulation techniques. An example of this is shown in FIGS. 4 and 5, where this approach has been extended to support 64-QAM modulation.

Figure 4:
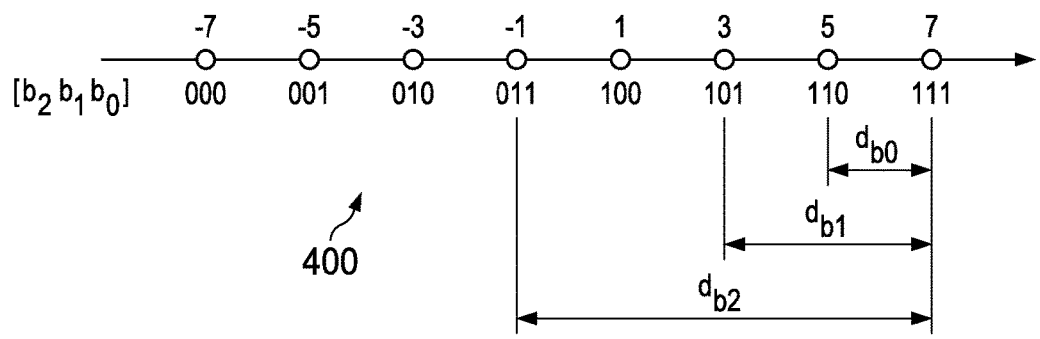
Figure 5:
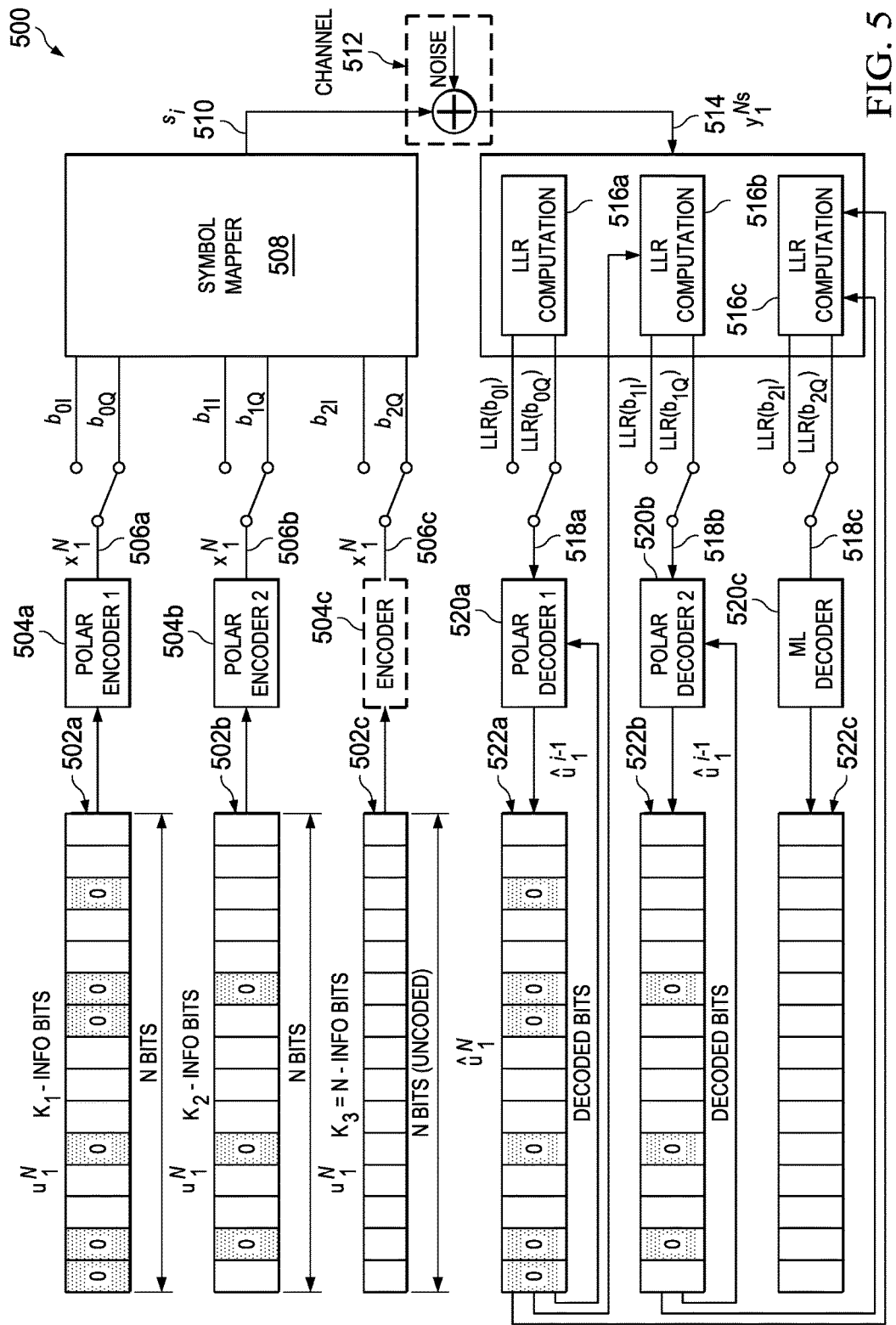

FIGS. 4 and 5 illustrate a second example implementation of a coding scheme with three bit levels, where different bit levels may be associated with different polar coding schemes. FIG. 4 illustrates an example symbol mapping 400, which can be used with 64-QAM modulation. Each of the I and Q directions independently uses the same mapping as 8-PAM, where ($b_2$ $b_1$ $b_0$) denotes the bit mapping to a symbol, with $b_2$ and $b_0$ representing the MSB and LSB, respectively. In FIG. 4, $d_{b0}$ represents the minimum Euclidian distance for $b_0$, $d_{b1}$ represents the minimum Euclidian distance for $b_1$ (assuming that the bit value for $b_0$ is correctly decoded and known at the receiver before making a decision for $b_1$), and $d_{b2}$ represents the minimum Euclidian distance for $b_2$ (assuming that the bit values for $b_0$ and $b_1$ are correctly decoded and known at the receiver before making a decision for $b_2$). In other words, during decoding, the bit value for $b_0$ is determined, the decoded bit value for $b_0$ is used to decode the bit value for $b_1$, and the decoded bit values for $b_0$ and $b_1$ are used to decode the bit value for $b_2$.

An encoding and decoding system 500 that supports this symbol mapping 400 is shown in FIG. 5. For higher-order modulations such as 64-QAM, one approach is to encode lower bit levels while leaving the MSB uncoded. An example of this is shown in FIG. 5, where input vectors $u_1^N$ 502a-502b (each containing N bits) are respectively provided to polar encoders 504a-504b, while input vectors $u_1^N$ 502c (each containing N bits) could remain uncoded. Alternatively, the input vectors 502c could be encoded using an encoder 504c. The encoder 504c could support any suitable code, such as a Bose, Chaudhuri and Hocquenghem (BCH) code to provide a certain level of error protection or a different polar code.

The polar encoders 504a-504b use the input vectors 502a-502b and different polar codes to generate codewords $x_1^N$ 506a-506b, respectively. Codewords $x_1^N$ 506c contain either the uncoded input vectors 502c or the outputs of the encoder 504c. The codewords 506a-506c are provided to a symbol mapper 508, which generates a series of transmit symbols 510. The symbols 510 are transmitted over at least one communication channel 512, which suffers from noise.

Received symbols $y_1^{Ns}$ 514 are obtained over the channel(s) 512, and LLR calculators 516a-516c use the received symbols 514 to generate LLR blocks 518a-518c. Polar decoders 520a-520b decode portions of the received symbols 514 using the LLR blocks 518a-518b and the polar codes to generate output vectors 522a-522b. A third decoder 520c decodes other portions of the received symbols 514 using the LLR blocks 518c to generate output vectors 522c. The decoder 520c could represent any suitable decoder, such as a maximum likelihood (ML) or other hard decoder (when the input vectors 502c are uncoded) or a BCH, polar, or other decoder (when the input vectors 502c are coded).

To support multilevel coding, the LLR calculators 516a-516c again operate sequentially on the received symbols 514. For example, in response to receiving a set of symbols 514, the LLR calculator 516a can output channel LLR blocks 518a (such as column vectors of length N) to the polar decoder 520a. The LLR calculator 516b uses a new output vector $\hat{u}_1^N$ 522a from the polar decoder 520a to output channel LLR blocks 518b to the polar decoder 520b.

The LLR calculator 516c uses the new output vectors $\hat{u}_1^N$ 522a-522b from the polar decoders 520a-520b to output channel LLR blocks 518c to the decoder 520c. Note again, however, that other forms of decoding could be used, such as list decoding or belief-propagation decoding.

FIGS. 6 and 7 illustrate an example implementation of a coding scheme in which one binary polar code may correspond to multiple bits for each of the I and Q directions. FIG. 6 illustrates an example symbol mapping 600, which can be used with 64-QAM modulation. Each of the I and Q directions independently uses the same Gray mapping, where ($b_2$ $b_1$ $b_0$) denotes the bit mapping to a symbol, with $b_2$ and $b_0$ representing the MSB and LSB, respectively. Note that the Gray mapping is applied only to the two least significant bits ($b_1$ and $b_0$) in this example, not across all eight constellation points in FIG. 6. This scheme allows large Euclidian distances for $b_2$ (MSB) with knowledge of correctly-decoded bits for $b_1$ and $b_0$. In this embodiment, the two least significant bits are protected with the polar code.

An encoding and decoding system 700 that supports this symbol mapping 600 is shown in FIG. 7. The encoding and decoding system 700 represents one example of a practical scheme for applying polar codes to MLC with higher-order modulation and the symbol mapping of FIG. 6. As shown in FIG. 7, input vectors 702a-702b are received, where the input vectors 702a contain twice the number of bits (2N) as the input vectors 702b (N). In the input vectors 702a, $K_1$ would equal 2N minus the number of frozen bits. The input vectors 702a are provided to a polar encoder 704a, which uses the input vectors 702a and a polar code to generate codewords 706a that are mapped to the two LSBs on each of the I and Q directions ($b_{0I}$, $b_{0Q}$, $b_{1I}$, and $b_{1Q}$).

The input vectors 702b may remain uncoded or be subjected to coding using an encoder 704b, such as a BCH encoder or another polar encoder with a high code rate. The uncoded or encoded input vectors 702b represent codewords 706b. The codewords 706a-706b are provided to a symbol mapper 708, which generates a series of transmit symbols 710. The symbols 710 are transmitted over at least one communication channel 712, which suffers from noise. Received symbols 714 are used by LLR calculators 716a-716b to generate LLR blocks 718a (for $b_{0I}$, $b_{0Q}$, $b_{1I}$, and $b_{1Q}$) and LLR blocks 718b (for $b_{2I}$ and $b_{2Q}$). A polar decoder 720a decodes the LLR blocks 718a using the polar code to generate output vectors 722a, while a decoder 720b (such as an ML, BCH, or polar decoder) decodes the LLR blocks 718b into output vectors 722b.

In the approach shown in FIG. 7, the symbols 710 can be grouped into blocks of size $N_s$. For 64-QAM, each symbol uses three bits in the I direction and three bits in the Q direction. Thus, input vectors 702a of 2N bits each are encoded using the polar encoder 704a with the polar code, and the resulting blocks of 2N bits are multiplexed to the I and Q dimensions for the 64-QAM symbols. The third bit level positions of the I and Q dimensions for the 64-QAM symbols come from the input vectors 702b or the outputs of the encoder 704b, which have a length of size N. Since a Gray coding is used, the LLR values are computed according to the different mapping. Two or more bits can be decoded together at bit levels where Gray mapping is used.

Note that FIG. 7 shows the polar encoder 704a handling the $b_0$ and $b_1$ bits and the encoder 704b optionally handling the $b_2$ bits. Similarly, FIG. 7 shows the polar decoder 720a handling the $b_0$ and $b_1$ bits and the decoder 720b handling the $b_2$ bits. These bit assignments are for illustration only, and other embodiments could be used. For instance, the polar encoder 704a could handle the $b_0$ bits, while the encoder 704b handles the $b_1$ and $b_2$ bits. In those embodiments, the polar decoder 720a would handle the $b_0$ bits, and the decoder 720b would handle the $b_1$ and $b_2$ bits.

In general, with respect to any of the embodiments shown in FIGS. 2 through 7, a polar code can be characterized by a set of parameters such as (N, K, A, $u_{Ac}$). Here, N denotes the output block size in bits, K denotes the input information size in bits, A denotes the set of indices of the information bits (which is complemented by Ac that contains the indices of the frozen bits), and $u_{Ac}$ denotes the values of the frozen bits. A standard generator matrix $G_N$ can be used for the encoding, such as:

$$G_N = B_N G_2^{\otimes n} \quad (1)$$

where $B_N$ is a bit reversal-based permutation matrix, and $G_2^{\otimes n}$ denotes the Kronecker product of $$G_2 = \begin{bmatrix} 1 & 0 \\ 1 & 1 \end{bmatrix}.$$

The polar code can have a length of $N=2^n$, with K denoting the dimension of the set of information bits |A|. With the generator matrix defined in Equation (1), the encoding can be described by:

$$x_1^N = u_1^N G_N \quad (2)$$

where $u_1^N$ is a row vector of length N of uncoded bits, and $x_1^N$ denotes a codeword (encoded bits) of length N. The code rate can be given by the ratio of K/N, while the set of frozen bits and their value are denoted by the vector $u_{Ac}$ of length N–K.

There are various challenges encountered in the construction of polar codes, such as when higher-order modulation symbols are sent over an AWGN channel. When M-QAM symbols are used, this can be described as:

$$y_k = s_k + n_k, \quad k = 1, 2, \ldots, N_s \quad (3)$$

where $s_k$ denotes the $k^{th}$ M-QAM symbol sent over the physical channel, $n_k$ denotes the complex AWGN $CN(0, \sigma^2)$ with zero mean and $\sigma^2$ variance, and $N_s$ denotes the number of symbols to transmit a code block.

By using a specially-designed symbol mapping rule (such as one shown in FIG. 2, 4, or 6), due to different Euclidean distances between symbols with 0 or 1 on bit levels from the bit-to-symbol mapping, different polar codes have different properties. For example, the second bit level is better protected than the first bit level, so the effective SNR on the first bit level is lower than the SNR on the second bit level. As a result, the code rate $R_1 = K_1/N$ (where $K_1$ is the number of information bits for the polar code on the first bit level and N is the code block length) is desired to be smaller than the code rate $R_2 = K_2/N$ of the polar code applied to the second bit level (where $K_2$ is the number of information bits for the polar code on the second bit level). One challenge in designing such polar codes involves choosing the appropriate code rates such that the error rates of the polar codes at different bit levels are similar or equal (such as within a threshold amount of one another).

The following represents an example technique for optimizing the code rates for the polar codes at different bit levels, although other techniques could be used. In one technique, rather than using the typical construction process of running Monte Carlo simulations to obtain polarization parameters for each SNR evaluation, one ordered set of equivalent channel indexes $W_N^{(i)}(u_i|y_1^N, \hat{u}_1^{i-1})$ can be used, where the ordered set is obtained from the SNR value affecting each bit level. The $W_N^{(i)}(u_i|y_1^N,\hat{u}_1^{i-1})$ notation used for the equivalent channel indexes above is described in Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009. For example, this can be done by analyzing the tail threshold value of probability density functions of vectors containing modified log likelihood ratios $mLLR(W_N^{(i)})$, which can be defined as:

$$mLLR\left(W_N^{(i)}\right) = \begin{cases} +|LLR(W_N^{(i)})|, & \text{if correct decision was made} \\ -|LLR(W_N^{(i)})|, & \text{if wrong decision was made} \end{cases} \quad (4)$$

The log-likelihood ratio is defined as:

$$LLR(W_N^{(i)}) = \log\left(\frac{W_N^{(i)}(Y_1^N, U_1^{i-1} | U_i = 0)}{W_N^{(i)}(Y_1^N, U_1^{i-1} | U_i = 1)}\right) \quad (5)$$

For a given channel SNR, a BER estimation can be determined using the mLLR values as follows. First, from a large set of mLLR data for binary modulation channels (such as data obtained from simulation), calculate a threshold $\tau^{(i)}(\beta)$ for a target probability of error $\beta$. For instance, denoting the distribution of mLLR data as $f^{(i)}(x)$, the threshold $\tau^{(i)}(\beta)$ can be calculated as:

$$\int_\infty^{\tau^{(i)}(\beta)} f^{(i)}(x)dx = \beta \quad (6)$$

In other embodiments, the mean and variance of the mLLR values can be calculated, and a Gaussian probability density function (PDF) can be constructed with the same mean and variance. This can be done using only second-order statistic information (mean and variance). Second, the effective channel is selected that has $\beta(\beta)<0$, and its code rate can be expressed as:

$$R = 1 - \frac{1}{N}\sum_{i=1}^{N} I\{\tau^{(i)}(\beta) > 0\} \quad (7)$$

where the indicator function $I\{\tau^{(i)}(\beta)>0\}$ equals one when $\tau^{(i)}(\beta)>0$ and zero otherwise. This approach can be used to identify the optimal code rate for MLC by selecting the individual bit levels' code rates so that the error rates of the bit levels are approximately equal. An example of this can be expressed as:

$$P_b^{(1)} \approx P_b^{(2)} \approx \ldots \approx P_b^{(q)} \approx \text{constant target error rate} \quad (8)$$
$$(\beta_{target})$$

where $P_b^{(i)}$ is the bit error rate for the $i^{th}$ level in the q-level MLC.

In particular embodiments, the following procedure can be used to select the polar codes for use in an MLC scheme. In the following, a rate design rule is based on keeping substantially the same frame error rate (FER) for each bit level. The set of frozen bits (equivalent to choosing the coding rate R) is selected for each polar code so that substantially the same FER is achieved at the effective SNR experienced at each bit level, which can be determined by the corresponding Euclidean distance of neighboring constellation points in the symbol mapping that is being used.

A receiver (such as the receiver 160 in FIG. 1B) can use a multistage decoding strategy, which could be viewed as a higher-level extension of the successive cancellation algorithm where there is progressive decoding of bit levels rather than individual bits. At the decoder, the bits at the first bit level (in both I and Q directions) are decoded first. These decoded bits are used to remove constellation points that have different bit assignments before computing the input LLRs for the bits of the second bit level, and the same process can be repeated with the higher bit levels. This increases the effective SNR at each bit level. The design of MLC polar coding in this approach involves two main operations, namely (i) identifying the code rate at each bit level and (ii) designing polar codes with different rates for a given operating SNR point (which is equivalent to choosing the set of frozen bits).

Consider an MLC configuration with a $2^{2q}$-ary digital modulation scheme. Let $\{K_j: j=0, \ldots q-1\}$ denote the set of information bits at each bit level, which gives the set of code rates $\{R_j: j=0, \ldots, q-1\}$ of the binary input alphabet polar codes of length N used at each bit level. Note that coding across the I and Q axes is symmetric. Let $P_f^{(j)}(\gamma)$ denote the probability of a frame error at the $j^{th}$ bit level (where j=0 for the LSB) at a channel SNR of $\gamma$ dB. If a specially-designed symbol mapping rule (such as in FIG. 2, 4, or 6) is used, the minimum distance between adjacent constellation points is doubled with increased bit levels (assuming all bits at the previous bit level are decoded correctly). For the embodiments in FIGS. 2 through 5, this could be viewed as increasing the effective SNR at each bit level by 6 dB such that the effective SNR $\gamma_j$ at the $j^{th}$ bit level is:

$$\gamma_j \text{ (dB)}=\gamma+6j \quad (9)$$

For the embodiments in FIGS. 6 and 7, this can be expressed as:

$$\gamma_2 \text{ (dB)}=\gamma_1+12 \quad (10)$$

The set of code rates $\{R_j\}$ can be chosen such that the same FER $P_f^{(j)}(\gamma_j)$ of the corresponding polar code is obtained (or at least in the same range) among all bit levels, which can be expressed as:

$$P_f^{(j)}(\gamma_j) \approx \overline{P}_F, j=0, \ldots, q-1 \quad (11)$$

where q is the number of bit levels per I/Q direction and $\overline{P}_F$ is the target FER that is minimized for the operating SNR. As an example, for 64-QAM, 8-PAM is used for both the I and Q components of the signal, and q=3. For the first bit level, the binary mapping of 8-PAM is defined by $b_{0I}$ and $b_{0Q}$ for the I and Q components, respectively. The rate design rule defined above states that, for a specific FER of the overall system, imposing substantially the same $P_f^{(j)}$ for each bit level's polar code induces different rates $R_j$ because of the different SNR $\gamma_j$ experienced by each bit level j. The overall code design problem is therefore reduced to the design of multiple polar codes at different SNRs, and the procedure described below can be used to design the polar codes.

A successive cancellation decoder can be used to decode the polar code at each bit level. Therefore, using the procedure from above, it is straightforward to show that the overall frame error rate $P_F(\gamma)$ for the MLC configuration is:

$$P_F(\gamma) \approx \sum_{j=0}^{q-1} P_f^{(j)}(\gamma + 6j) \quad (12)$$

Solving Equation (12) for the different code rates uses an explicit relation between the code rate and the frame error rate at all SNR values, which may not be available in general. Therefore, a pragmatic approach can be used that exploits the fact that the performance is in general characterized by the weakest $P_f^{(j)}$. Therefore, to maximize the MLC efficiency for a given target for $P_F(\gamma)$, the code rates for the various bit levels can be selected such that:

$$P_f^{(0)}(\gamma) \approx P_f^{(1)}(\gamma+6) \approx P_f^{(2)}(\gamma+12) \approx \ldots \quad (13)$$

In this case, the target frame error rate for each bit level is $P_F(\gamma)/q$, and the code rates are chosen according to the effective SNR for each bit level.

By identifying the operating SNR and FER of each bit level j, the rate $R_j$ and the corresponding set of unfrozen bits can be determined as follows. With this design, the low complexity of the encoder and decoder of binary input alphabet polar codes is maintained while increasing spectral efficiency through sending M-QAM symbols over a channel. A polar code can be designed for a given operating SNR and FER point using the mLLR values from Equation (4). Using, for example, Monte Carlo simulations, the first two moments of the mLLR values (the mean $m_i$ and the standard deviation $\sigma_i$) can be determined. An SC decoder with a random set of information bits can be used for which, at each equivalent bit channel, all previously decoded bits are assumed to be known. Note that the use of an SC decoder is optional and that other decoder realizations could be used, such as a list decoder or a belief-propagation decoder. Furthermore, the assumption that a channel is an AWGN channel is for illustration only, and other channel types could be used. If the PDF of the mLLR values is known, the probability of error of the equivalent bit channels can be directly evaluated. For example, the Gaussian approximation of a PDF can be calculated using the first two moments. This approximation is adequately accurate for highly-positive polarized equivalent bit channels. With a Gaussian approximation, the probability of bit error at the $i^{th}$ equivalent bit channel (assuming all other previous bits are decoded properly) can be expressed as:

$$\beta_i = Q(m_i/\sigma_i) \quad (14)$$

where:

$$Q(x) \triangleq \frac{1}{\sqrt{2\pi}} \int_x^\infty \exp(-x^2/2) \quad (15)$$

After computing $\beta_i$ for all input bit locations, the indices of the information bits A are chosen to correspond to the equivalent bits with the smallest values of $\{\beta_i\}$. The frame error probability $P_F$ can then be calculated as:

$$P_F = 1 - \prod_{i \in A}(1-\beta_i) \approx \sum_{i \in A} \beta_i \quad (16)$$

In general, $\{\beta_i\}$ are functions of the channel SNR $\gamma$, but their order tends to be insensitive to small changes in the SNR as the SNR increases. This can be important in practical communication systems since the operating region (the waterfall region of the SNR/BER curve) for a given code rate is typically within 1-2 dB and it may be necessary to have consistent ordering for that range.

Thus, for example, in a practical communication system that uses adaptive modulation, a single list can be stored that contains the universal ordering of the equivalent bit channels within a certain SNR range. A distinct list can be used for each modulation order. In each list, the indices of the bits at the top of the list can be assigned as frozen bits. The number of frozen bits (which corresponds to the code rate) can be determined by the SNR. This arrangement significantly simplifies the mechanism of designing the modulation and coding scheme (MCS) of a system. The above design procedure could be combined with any modulation scheme, where the modulation and the corresponding LLR calculation of the individual bits within each symbol are considered part of the underlying channel. With the above parameterization, the code rate $|A|/N$ for a frame error rate $\overline{P}_F$ could be computed analytically. For a given $\overline{P}_F$, the maximum code rate can correspond to a value calculated as follows:

$$\max|A| \text{ such that } \sum_{i \in A} \beta_i \leq \overline{P}_F \quad (17)$$

where it is assumed that the indices in A are sorted in ascending order of $\beta_i$.

One advantage of the proposed solution described above is the use of "true" polarization parameters for choosing the sets of frozen bits and information bits. This can be particularly useful, for example, when more than one communication channel is used for physical transmission. One limiting constraint of conventional polar codes is that the same physical channel is to be used for each equivalent bit channel. However, two or more channels can still provide polarization to the equivalent channels when the initial $G_2$ matrix is used as the base for the generator matrix. This means that the equivalent channels with the highest polarization levels can be used for transmitting the information bits, instead of some mismatched sets that are optimized for different system properties.

Note that the symbol mapping rules (such as the ones shown in FIGS. 2, 4, and 6) can introduce a desired property, such as increasing minimum Euclidian distance when moving to higher bit-levels. Gray mapping-based symbol mappings typical do not give such a desired property.

The components shown in FIGS. 3, 5, and 7 could be implemented in any suitable manner. For example, the components shown in FIGS. 3, 5, and 7 could be implemented using only hardware components or a combination of hardware and software/firmware instructions. As particular examples, the components shown in FIGS. 3, 5, and 7 could be implemented using one or more FPGAs, ASICs, or other hardware-only components. The components shown in FIGS. 3, 5, and 7 could also be implemented using one or more processing devices that execute software/firmware instructions for performing the described functions. A combination of approaches could also be used, such as when some components are implemented using only hardware and other components are implemented using one or more processing devices that execute software/firmware instructions.

Although FIGS. 2 through 7 illustrate examples of encoding and decoding schemes supporting MLC with binary alphabet polar codes, various changes may be made to FIGS. 2 through 7. For example, this disclosure is not limited to the use of two polar codes at two bit levels of an MLC scheme. Two or more binary alphabet polar codes can be used at two or more bit levels of an MLC scheme.

Figure 8A:
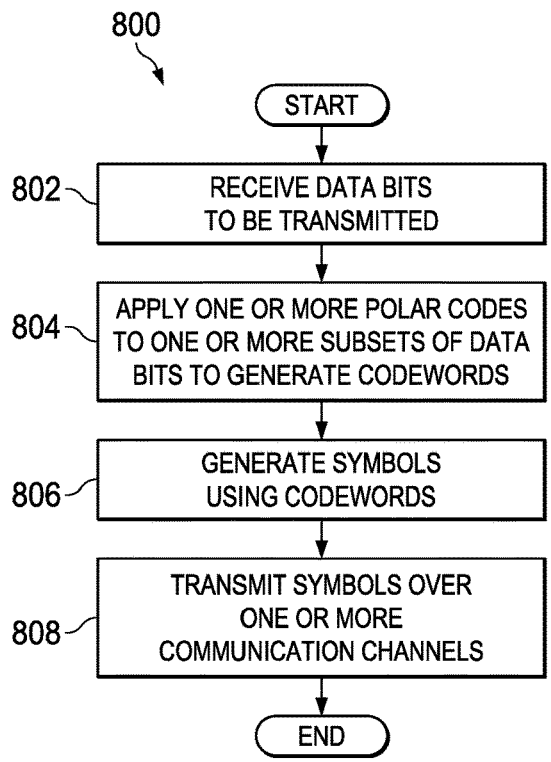
FIGS. 8A and 8B illustrate example methods for using MLC with binary alphabet polar codes in accordance with this disclosure.
Figure 8B:
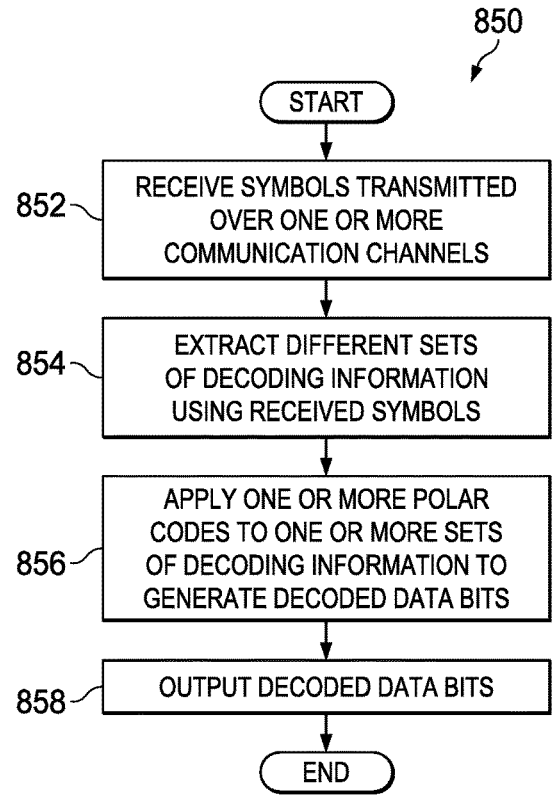

FIGS. 8A and 8B illustrate example methods for using MLC with binary alphabet polar codes in accordance with this disclosure. In particular, FIG. 8A illustrates an example method 800 that could be used by an encoder supporting MLC, and FIG. 8B illustrates an example method 850 that could be used by a decoder supporting MLC. These methods 800 and 850 could, for example, be used by the base stations 102-104 or by the transmitter 150 and receiver 160 to communicate over one or more wireless or other communication channels. However, the methods 800 and 850 could be used with any other suitable devices and in any other suitable systems.

As shown in FIG. 8A, data bits to be transmitted are received at step 802. This could include, for example, receiving one or more input vectors 302a-302b, 502a-502c, 702a-702b containing data bits to be transmitted. One or more polar codes are applied to one or more subsets of the bits to generate codewords at step 804. This could include, for example, the polar encoders 304a-304b, 504a-504b applying different polar codes to different input vectors 302a-302b, 502a-502b. This could also include the polar encoder 704a applying a polar code to the input vectors 702a. Note that some bits, such as most significant bits, may or may not be encoded during the generation of the codewords.

Symbols are generated using the codewords at step 806. This could include, for example, the symbol mapper 308, 508, 708 mapping the codewords to different QAM symbols based on an appropriate symbol mapping, such as the symbol mapping 200, 400, or 600. The symbols are transmitted over one or more communication channels at step 808. This could include, for example, transmitting the symbols over one or more AWGN channels.

As shown in FIG. 8B, symbols transmitted over one or more communication channels are received at step 852. This could include, for example, receiving the symbols over one or more AWGN channels. Different sets of decoding information are extracted from the received symbols at step 854. This could include, for example, the LLR calculators 316a-316b, 516a-516c, 716a-716b identifying LLR values using the received symbols. The LLR calculators can operate sequentially such that the LLR calculator on one bit level generates LLR values using decoded outputs from the decoder on at least one earlier bit level.

One or more polar codes are applied to one or more of the different sets of decoding information to generate decoded bits at step 856. This could include, for example, the polar decoders 320a-320b, 520a-520b applying different polar codes to different LLR blocks 318a-318b, 518a-518b at different bit levels. This could also include the polar decoder 720a applying a polar code to the LLR blocks 718a. In either case, the coding rate(s) of the polar code(s) allow(s) the different bit levels to have substantially similar error rates. Note that some bits (such as most significant bits at an additional bit level) could be decoded in other ways (such as by using an ML or BCH decoder). The decoded data bits at the bit different bit levels are output at step 858.

Although FIGS. 8A and 8B illustrate examples of methods for using MLC with binary alphabet polar codes, various changes may be made to FIGS. 8A and 8B. For example, while shown as a series of steps, various steps in each figure could overlap, occur in parallel, or occur any number of times.

Figure 9:
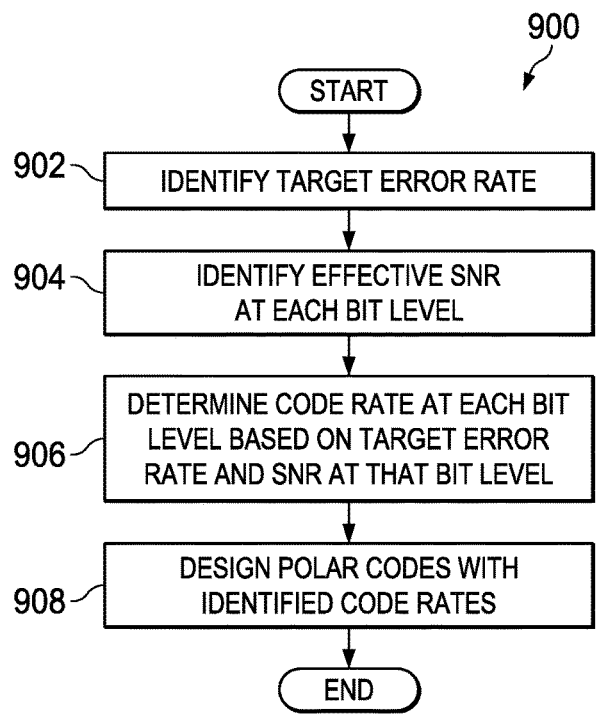
FIG. 9 illustrates an example method for designing an MLC coding scheme with binary alphabet polar codes in accordance with this disclosure.

FIG. 9 illustrates an example method 900 for designing an MLC coding scheme with binary alphabet polar codes in accordance with this disclosure. The method 900 could, for example, be performed offline one or more times prior to creating an encoding or decoding design.

As shown in FIG. 9, a target error rate is identified at step 902. This could include, for example, identifying a desired target FER for communications. The desired target FER could be based on the specific application or any other suitable criteria. An effective SNR at each of multiple bit levels associated with a particular symbol mapping rule is identified at step 904. As noted above, the symbol mapping rule may be designed to have a property that provides increased Euclidian distance as one goes to higher bit levels in MLC with knowledge of correctly-decoded bits for earlier bit level(s). For example, as noted above, the symbol mappings could provide a known increase to the effective SNR at each bit level, such as by 6 dB or 12 dB.

The code rate at each bit level is determined using the target error rate and the SNR at that bit level at step 906, and the polar codes are designed with the identified code rates at step 908. This could include, for example, selecting the code rates as described above so that the overall error rate of each polar code is substantially equivalent. This could also include using the mLLR values from Equation (4), determining their mean $m_i$ and standard deviation a, constructing Gaussian PDFs using these values, estimating error rates using the PDFs, and selecting the bit locations with the worst error rates as the frozen bits.

Although FIG. 9 illustrates one example of a method 900 for designing an MLC coding scheme with binary alphabet polar codes, various changes may be made to FIG. 9. For example, while shown as a series of steps, various steps in FIG. 9 could overlap, occur in parallel, occur in a different order, or occur any number of times. Also, note that while multiple polar codes are designed in FIG. 9, a single polar code could be designed, such as for use in the system 700 of FIG. 7.

Figure 10:
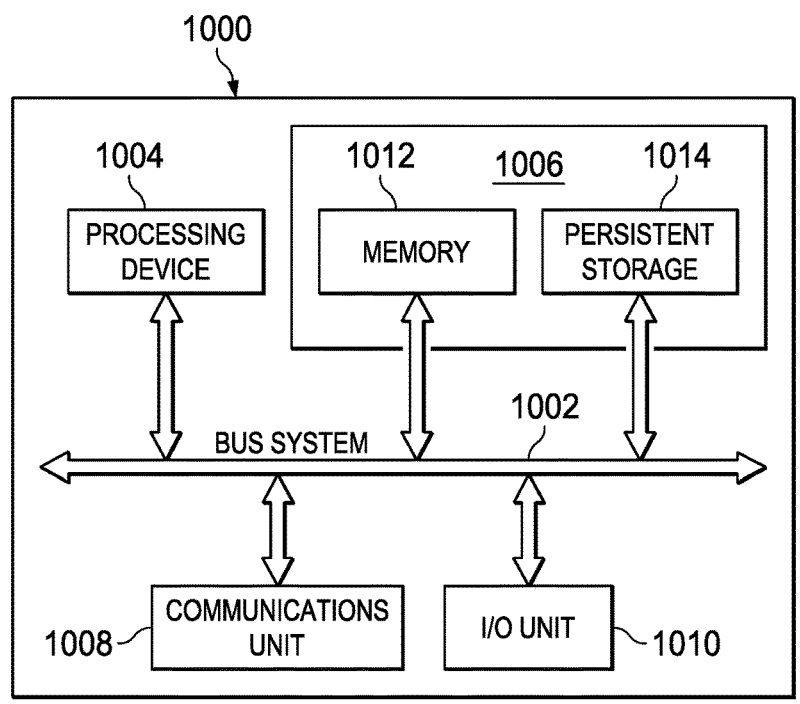
FIG. 10 illustrates an example device supporting the design of an MLC coding scheme with binary alphabet polar codes in accordance with this disclosure.

FIG. 10 illustrates an example device 1000 supporting the design of an MLC coding scheme with binary alphabet polar codes in accordance with this disclosure. The device 1000 could, for example, be used to implement the method 900 shown in FIG. 9 in order to design an MLC coding scheme with binary alphabet polar codes. Note, however, that the method 900 could be performed using other devices.

As shown in FIG. 10, the device 1000 includes a bus system 1002. The bus system 1002 is configured to support communication between at least one processing device 1004, at least one storage device 1006, at least one communications unit 1008, and at least one input/output (I/O) unit 1010.

The processing device 1004 is configured to execute instructions that can be loaded into a memory 1012. The device 1000 can include any suitable number(s) and type(s) of processing devices 1004 in any suitable arrangement. Example processing devices 1004 can include microprocessors, microcontrollers, digital signal processors, field programmable gate arrays, application specific integrated circuits, and discrete circuitry. The processing device(s) 1004 can be configured to execute processes and programs resident in the memory 1012.

The memory 1012 and a persistent storage 1014 can represent any structure(s) capable of storing and facilitating retrieval of information (such as data, program code, or other suitable information on a temporary or permanent basis). The memory 1012 can represent a random access memory or any other suitable volatile or non-volatile storage device(s). The persistent storage 1014 can contain one or more components or devices supporting longer-term storage of data, such as a read-only memory, hard drive, Flash memory, or optical disc.

The communications unit 1008 is configured to support communications with other systems or devices. For example, the communications unit 1008 can include a network interface card or a wireless transceiver facilitating communications over a network. The communications unit 1008 can be configured to support communications through any suitable physical or wireless communication link(s).

The I/O unit 1010 is configured to allow for input and output of data. For example, the I/O unit 1010 can be configured to provide a connection for user input through a keyboard, mouse, keypad, touchscreen, or other suitable input device. The I/O unit 1010 can also be configured to send output to a display, printer, or other suitable output device.

Although FIG. 10 illustrates one example of a device 1000 supporting the design of an MLC coding scheme with binary alphabet polar codes, various changes may be made to FIG. 10. For example, various components in FIG. 10 could be combined, further subdivided, or omitted and additional components could be added according to particular needs. In general, computing devices can come in a wide variety of configurations, from servers to desktop or laptop computers to portable devices such as mobile smartphones. FIG. 10 does not limit this disclosure to any particular computing device.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   determining, by at least one processor, a target error rate associated with a multilevel coding scheme, the multilevel coding scheme having multiple bit levels;
   determining, by the at least one processor, an effective signal-to-noise ratio (SNR) at each of the bit levels, the effective SNR based on a symbol mapping rule for mapping bits to symbols;
   determining, by the at least one processor, code rates comprising a code rate at each bit level using the target error rate and the SNR at that bit level; and
   selecting, by the at least one processor, at one or more of the bit levels, at least one polar code having at least one of the code rates.

2. The method of claim 1, wherein the target error rate is a target frame error rate (FER) for communications.

3. The method of claim 1, wherein determining the target error rate is performed based on a specific application.

4. The method of claim 1, wherein the symbol mapping rule provides increased Euclidian distance for higher bit levels.

5. The method of claim 1, wherein the SNR at each bit level is higher than an SNR at a lower bit level.

6. The method of claim 1, wherein an overall error rate of each bit level is substantially equal.

7. The method of claim 1, wherein selecting the at least one polar code is performed based on modified log likelihood ratios (mLLRs).

8. The method of claim 7, wherein selecting the at least one polar code comprises:
   determining a mean of the mLLRs;
   determining a standard deviation of the mLLRs;
   constructing Gaussian probability density functions (PDFs) based on the mean of the mLLRs and the standard deviation of the mLLRs;
   estimating error rates for bit locations based on the Gaussian PDFs; and
   selecting bit locations with high error rates of the error rates as frozen bits.

9. The method of claim 1, further comprising:
   encoding multiple bits using the at least one polar code, to generate encoded bits; and
   transmitting the encoded bits.

10. The method of claim 1, further comprising:
   receiving symbols;
   extracting sets of decoding information based on the symbols; and
   applying the at least one polar code to at least one of the sets of decoding information.

11. A device comprising:
   at least one processor; and
   a non-transitory computer readable medium storing a program for execution by the at least one processor, the program including instructions to:
      determine a target error rate associated with a multilevel coding scheme, the multilevel coding scheme having multiple bit levels;
      determine an effective signal-to-noise ratio (SNR) at each of the bit levels, the effective SNR based on a symbol mapping rule for mapping bits to symbols;

determine code rates comprising a code rate at each bit level using the target error rate and the SNR at that bit level; and select at one or more of the bit levels, at least one polar code having at least one of the code rates.

12. The device of claim 11, wherein the target error rate is a target frame error rate (FER) for communications.

13. The device of claim 11, wherein the symbol mapping rule provides increased Euclidian distance for higher bit levels.

14. The device of claim 11, wherein the SNR at each bit level is higher than an SNR at a lower bit level.

15. The device of claim 11, wherein an overall error rate of each bit level is substantially equal.

16. The device of claim 11, wherein the instructions to select the at least one polar code are performed based on modified log likelihood ratios (mLLRs).

17. The device of claim 16, wherein the instructions to select the at least one polar code comprise instructions to:
determine a mean of the mLLRs;
determine a standard deviation of the mLLRs;
construct Gaussian probability density functions (PDFs) based on the mean of the mLLRs and the standard deviation of the mLLRs;
estimate error rates for bit locations based on the Gaussian PDFs; and
select bit locations with high error rates of the error rates as frozen bits.

18. The device of claim 11, wherein the instructions further comprise instructions to:
encode multiple bits using the at least one polar code, to generate encoded bits; and
transmit the encoded bits.

19. The device of claim 11, wherein the instructions further comprise instructions to:
receive symbols;
extract sets of decoding information based on the symbols; and
apply the at least one polar code to at least one of the sets of decoding information.

20. A non-transitory computer readable medium storing a program for execution by at least one processor, the program including instructions to:
determine a target error rate associated with a multilevel coding scheme, the multilevel coding scheme having multiple bit levels;
determine an effective signal-to-noise ratio (SNR) at each of the bit levels, the effective SNR based on a symbol mapping rule for mapping bits to symbols;
determine code rates comprising a code rate at each bit level using the target error rate and the SNR at that bit level; and
select at one or more of the bit levels, at least one polar code having at least one of the code rates.

* * * * *